United States Patent [19]

Matsuura

[11] Patent Number: 4,528,522

[45] Date of Patent: Jul. 9, 1985

[54] FM TRANSCEIVER FREQUENCY SYNTHESIZER

[75] Inventor: Takashi Matsuura, Tokyo, Japan

[73] Assignee: Nippon Electric Co., Ltd., Tokyo, Japan

[21] Appl. No.: 420,690

[22] Filed: Sep. 12, 1982

[30] Foreign Application Priority Data

Sep. 28, 1981 [JP] Japan .............................. 56-153402

[51] Int. Cl.³ .......................... H03L 7/22; H03C 3/08
[52] U.S. Cl. ......................................... 331/2; 331/16; 331/23; 332/18; 332/19; 455/76; 455/77
[58] Field of Search ................ 331/2, 16, 23; 455/43, 455/76, 77, 84, 86, 87, 119, 126; 332/16 R, 18, 19, 30 V

[56] References Cited

U.S. PATENT DOCUMENTS 3,307,119 2/1967 Holzwarth et al. .............. 332/19 X
4,409,563 10/1983 Vandegraaf ...................... 332/19 X

FOREIGN PATENT DOCUMENTS 1222993 8/1966 Fed. Rep. of Germany .......... 331/2
112044 8/1980 Japan ..................................... 331/2
45740 3/1982 Japan ................................... 455/76
1301840 1/1973 United Kingdom .................... 331/2

Primary Examiner—Eugene R. LaRoche
Assistant Examiner—D. C. Mis
Attorney, Agent, or Firm—Sughrue, Mion, Zinn, Macpeak & Seas

[57] ABSTRACT

A frequency synthesizer used for a frequency modulation (FM) transceiver which uses negative feedback to make the modulation characteristics linear and stable over a wide frequency range. The negative feedback is comprised of a frequency mixer, which mixes the outputs of a local oscillator and a voltage controlled oscillator, and a frequency divider and demodulator, which act on the output of the frequency mixer and supply the demodulated output signal to an adder, where it is added in reverse phase to the modulating signal.

10 Claims, 3 Drawing Figures

FM TRANSCEIVER FREQUENCY SYNTHESIZER

BACKGROUND OF THE INVENTION

The present invention relates to a frequency synthesizer and, more particularly, to a frequency synthesizer used for a frequency modulation (FM) transceiver.

An FM transceiver which has multiple frequency channels needs a local oscillation frequency for reception and a carrier frequency for transmission. These frequencies have to be changed depending on the frequency appropriation for the channels. A frequency synthesizer having a phase locked loop (PLL) is often used as a source of high frequency oscillation adapted to such frequency change. One example of such frequency synthesizer is disclosed in the pending U.S. patent application Ser. No.157,797 by Y. Mizota, entitled "Radio Subscriber System", assigned to the present applicant and filed on June 9, 1980, now U.S. Pat. No. 4,373,205.

In a frequency synthesizer of this type, which will be described later in greater detail, the output of a reference oscillator is led to both a first oscillator circuit with the PLL for transmission and a second one similar to the first one for reception. Each oscillator circuit having the PLL includes a variable frequency divider, whose dividing ratio is varied with a channel designation signal, thereby to provide the transmission or reception frequency. The PLL-equipped oscillator circuit for transmission is used also as a modulator, in which a modulating signal is applied to its voltage-controlled oscillator (VCO) together with a control voltage representative of the frequency difference between the VCO output and the reference oscillation.

The frequency deviation Δf present in the above-mentioned VCO output within the PLL is given by:

$$\Delta f = K_v V_m \qquad (1)$$

wherein $K_v$ (Hz/V) is the modulation sensitivity of the VCO and $V_m$ (V), the level of the modulating signal. Therefore, in order to achieve sufficiently linear and stable modulation, the modulation sensitivity $K_v$ is required to be linear over a wide range of the modulating signal voltage and stable over a broad frequency and temperature range.

The modulating sensitivity $K_v$ of a conventional FM transceiver of this type is not stable enough to satisfy these requirements, unless a complicated circuit structure is relied on.

SUMMARY OF THE INVENTION

An object of the present invention, therefore, is to provide a frequency synthesizer having an FM function whose modulation characteristics are made linear and stable over a wide frequency range, without employing any additional circuit elements for the VCO constituting the synthesizer.

The present invention is characterised in that a portion of the modulated carrier wave obtained at the output of the PLL-equipped oscillator is demodulated into the modulating signal, which is then added to the modulating signal itself in a reverse phase to achieve a negative feedback, thereby to stabilize the modulation characteristic over a broad frequency range and a wide range of the modulating signal voltage.

According to the present invention, there is provided a frequency synthesizer comprising: means for generating a reference oscillation; and oscillator means for generating in response to the reference oscillation a local oscillation signal for reception of an incoming carrier wave; a voltage-controlled oscillator means responsive to a control signal for generating an outgoing carrier wave for transmission; a first frequency divider means for frequency-dividing by a prescribed ratio the frequency of the outgoing carrier wave in response to a transmission channel designation signal; a phase comparator means for comparing the phases of the output of the first frequency divider means and that of the reference oscillation; a lowpass filter means for filtering the output of the phase comparator means and supplying the filtered output to the voltage-controlled oscillator means as the control signal; a frequency mixer means for frequency-mixing the output of the oscillator means and that of the voltage-controlled oscillator means to provide a signal representative of a frequency equal to the frequency difference between them; means for adding a modulating signal to the control signal to supply the sum of the voltage-controlled oscillator means; and means for negatively feeding back the output of the frequency mixer means to the adding means so that the modulation sensitivity of the voltage-controlled oscillator means to the modulating signal is substantially constant over a broad range of the frequency and over a broad range of the level of the modulating signal.

BRIEF DESCRIPTION OF THE DRAWINGS

Other features and advantages of the present invention will become more apparent from the detailed description hereunder taken in conjunction with the accompanying drawings, wherein.

DESCRIPTION OF THE PRIOR ART

Figure 1:
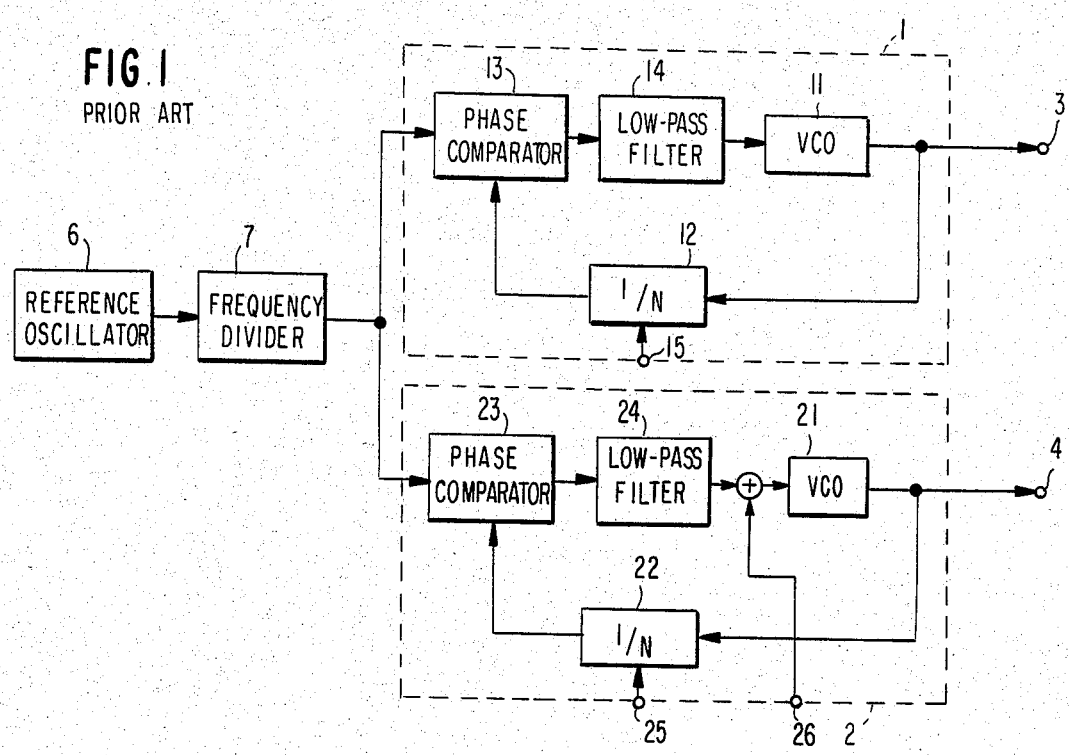
FIG. 1 is a schematic block diagram of a conventional frequency synthesizer.

Referring to FIG. 1, a conventional frequency synthesizer has a reception oscillator circuit 1 and a transmission oscillator circuit 2, from whose output terminals 3 and 4 are supplied, respectively, the local oscillation signal for reception and the carrier wave for transmission. The oscillator circuit 1 is composed of a PLL circuit having the voltage-controlled oscillator (VCO) 11, a frequency divider 12, a phase comparator 13 and a low-pass filter (LPF) 14 to constitute a phase-locked loop. The frequency divider 12 is provided with a reception channel designation signal from a terminal 15. The transmission oscillator circuit 2 also is composed of a PLL circuit including a VCO 21, a frequency divider 22, a phase comparator 23 and an LPF 24. To the frequency divider 22 is provided a transmission channel designation signal from a terminal 25. In response to the channel designation signals supplied from the terminals 15 and 25, the frequency dividing ratios of the frequency dividers 12 and 22 are varied to alter the output frequencies of the oscillator circuits 1 and 2.

The phase comparators 13 and 23 are respectively provided with a reference frequency signal from a frequency divider 7, with which an output of a single reference oscillator 6 is frequency divided. A modulating signal is provided to terminal 26 of the oscillator circuit 2 and this modulating signal is added to the output of the LPF 24 and supplied to the control input of the VCO 21.

In response to the modulating signal, there arises a frequency deviation Δf in the carrier frequency supplied to the terminal 4. Thus, the oscillator circuit 2 constituting a part of the synthesizer also serves as a modulator. If the cut-off frequency of the LPF 24 is selected to be lower than the lowest frequency of the modulating signal, the LPF operates stably without being affected by the modulating signal. However, since the stability and linearity of a modulator of this type vary with the operating frequency and with the voltage level of the modulating signal and the modulation sensitivity of the VCO 21 as stated above, the improvement in such characteristics of the modulator cannot be achieved without making the VCO 21 further complicated for a higher modulation sensitivity, stability and so forth.

DETAILED DESCRIPTION OF PREFERRED EMBODIMENTS

Figure 2:
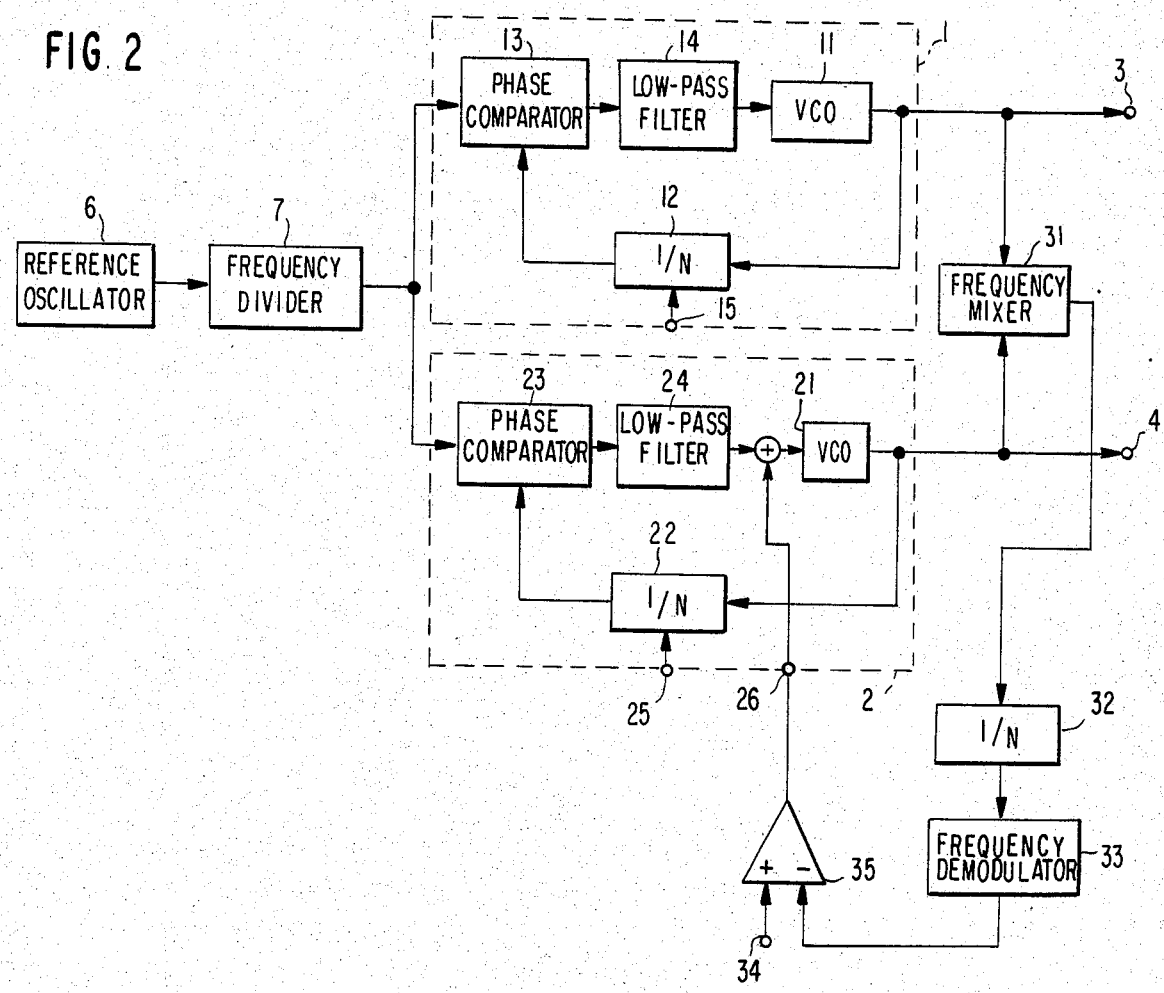
FIG. 2 is a schematic block diagram illustrating a frequency synthesizer embodying the present invention.

Referring to FIG. 2 in which like structural elements are denoted by like reference numerals, one embodiment of the present invention has a circuit structure suitable for use where frequencies are so arranged that the difference between the transmission frequency and the reception frequency will be constant.

Both the local oscillation and the carrier wave provided at the terminals 3 and 4 are supplied to a mixer 31 to provide a signal of a frequency equal to the frequency difference between the local oscillation and the carrier wave. The output of the mixer 31 is frequency-divided by a frequency divider 32, and is then demodulated by a demodulator 33. The demodulated output signal equivalent to the modulating signal is added to the modulating signal in a reverse phase by supplying the demodulated output signal to the negative terminal of an adder circuit 35 comprised of a differential amplifier and supplying the modulating signal to the positive terminal of the adder circuit 35 via the terminal 34. The output of the adder circuit 35 is applied to the control input of the VCO 21 via the terminal 26.

The circuit including the mixer 31, the frequency divider 32, the demodulator 33 and the adder 35 constitutes a negative feed back circuit for the modulating signal. Accordingly, the frequency deviation Δf (Hz) of the output of the VCO 21 due to the frequency modulation is given by:

$$\Delta f = \frac{K_v}{1 + \frac{K_v \cdot K_D}{N}} \cdot V_m \quad (2)$$

where $K_v$ (Hz/V) is the modulation sensitivity of the VCO 21; $K_D$ (V/Hz), the demodulation sensitivity of the demodulator 33; N, the frequency dividing ratio of the frequency divider 32; and $V_m$ (V), the level of the modulating signal supplied at the terminal 34. If the modulation sensitivity $K_v$ is set at a value large enough to satisfy $$K_v >> \frac{N}{K_D} \quad (3)$$

the following relationship holds:

$$\Delta f = \frac{N}{K_D} \cdot V_m \quad (4)$$

Therefore, the frequency deviation Δf depends on the demodulation sensitivity $K_D$ of the demodulator 33.

The stability of the demodulator 33 is easy to achieve because the input thereto has a frequency which is lowered by the mixer 31 and the frequency divider 32 into a frequency considerably lower than the carrier output frequency supplied from the VCO 21. Moreover, where frequencies are so arranged that the difference between the transmission frequency and the reception frequency is constant as described above, the output frequency of the mixer 31 is constant, and so is the input carrier frequency of the demodulator 33. Therefore, it is sufficient for the sensitivity $K_D$ to be kept constant at a single frequency. As a result, the designing and production of the whole circuit is facilitated.

Further, even if distortion arises due to poor linearity of the modulation sensitivity $K_v$, such distortion can be negated by the aforementioned negative feedback.

Figure 3:
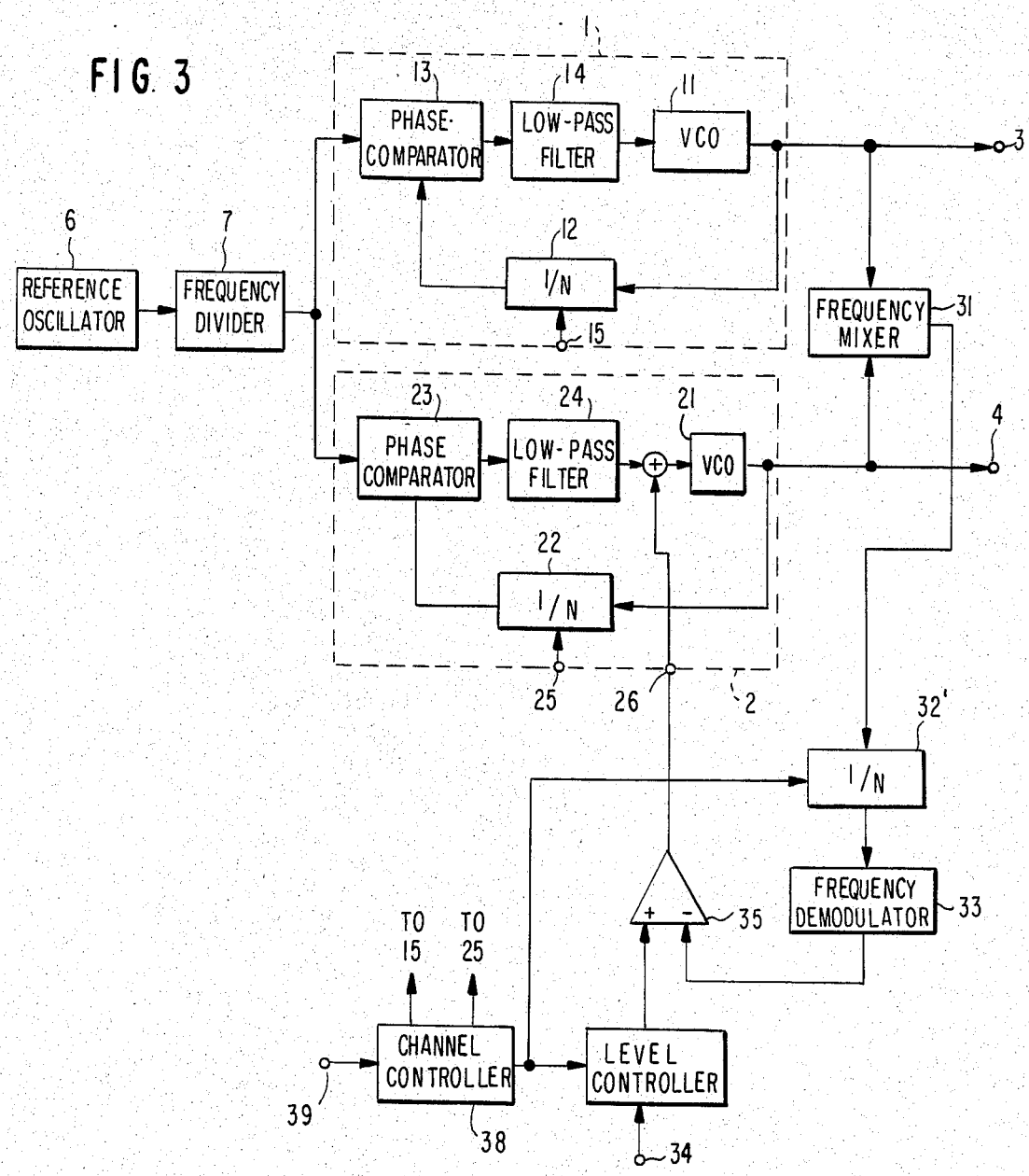
FIG. 3 is a schematic block diagram illustrating another frequency synthesizer embodying the present invention.

Referring to FIG. 3, a second preferred embodiment of the present invention shown therein is suitable for use where the difference between the transmission frequency and the reception frequency varies with the channels. Thus, the output frequency of the mixer 31 varies with the channels. The reception and transmission frequencies are changed by channel designation signals supplied through the terminals 15 and 25 from a channel controller 38, to which a channel designation signal is supplied through a terminal 39. A frequency divider 32' is of the variable type, whose frequency dividing ratio is so varied that the frequency of the input to the demodulator 33 may not substantially change even if the output frequency of the mixer 31 changes. At the same time, the level $V_m$ of the modulating signal has to be changed because the change in the frequency dividing ratio N results in a change in the frequency deviation Δf as predicted by Equation (4) given above. The circuit for this purpose is a level controller 37 which level-controls the modulating signal supplied from the terminal 34 and then supplies the same to the adder circuit 35. Control signals for the level controller 37 and the frequency divider 32 are given by the channel controller 38.

The level change rate of the level controller 37, as suggested by Equation (4) above, should most preferably be the reciprocal of the change rate of the frequency dividing ratio N so that $N \cdot V_m$ will be constant.

Further, the present invention is also applicable to a circuit composition in which the reception oscillator circuit 1 is a quartz-controlled oscillator or the like instead of a PLL. Such a circuit composition would be suitable for use where the reception frequency need not be changed and only the transmission frequency is varied. In that case, the same effects can be achieved.

As hitherto described, according to the present invention, a signal derived from the modulated carrier wave is negatively fed back to the modulating signal, so that the nonlinearity of the modulation is cancelled. This significantly improves the linearity of modulation. Whereas the stability of modulation characteristics is determined by the sensitivity of the low-frequency operating-demodulator included in the negative feedback loop, such a demodulator can be readily designed and produced to be sufficiently stable so as to substantially improve the stability of the modulation characteristics. The present invention can be embodied without altering the high frequency VCO circuit, requiring only an additional which can be readily applied to those employed in the conventional circuit.

What is claimed is:

1. A transceiver frequency synthesizer comprising: means for generating a reference oscillation; an oscillator means for generating in response to said reference oscillation a local oscillation signal for use in receiving an incoming carrier wave, the frequency of said local oscillation signal being changed in response to a reception channel designation signal; a voltage-controlled oscillator means responsive to a control signal for generating an outgoing carrier wave for use in transmission; a first frequency divider means for frequency-dividing by a prescribed divisor the frequency of said outgoing carrier wave in response to a transmission channel designation signal; a phase comparator means for comparing the phases of the output signal of said first frequency divider means and said reference oscillation; a lowpass filter means for filtering the output signal of said phase comparator means and supplying a filter output signal to said voltage-controlled oscillator means as a portion of said control signal; a frequency mixer means for frequency-mixing the output signal of said oscillator means and that of said voltage-controlled oscillator means to provide a difference signal representative of a frequency difference between them; first adding means for adding a modulating signal to said filter output signal and for providing the sum to said voltage-controlled oscillator means as said control signal; and means for negatively feeding back said difference signal to said first adding means so that the modulation sensitivity of said voltage-controlled oscillator means to said modulating signal is substantially constant over a broad range of the outgoing carrier wave frequencies and over a broad range of modulating signal levels.

2. A transceiver frequency synthesizer as claimed in claim 1, wherein the frequency difference between said local oscillation signal and said outgoing carrier wave is constant, and wherein said negative feedback means comprises a second frequency divider means for frequency-dividing said frequency difference by a respective prescribed divisor; a demodulator means for frequency-demodulating the output signal of said second frequency divider means; and a second adding means for adding the output signal of said demodulator means to said modulating signal, supplied to said first adding means, in reverse phase.

3. A transceiver frequency synthesizer as claimed in claim 1, wherein the frequency difference between said local oscillation signal and said outgoing carrier wave varies with a channel designation signal, and wherein said negative feedback means comprises a second frequency divider means for frequency dividing said frequency difference by a variable divisor in accordance with a divisor control signal;

a demodulator means for frequency-demodulating the output signal of said second frequency divider means;

a level controller means for controlling the level of said modulating signal in accordance with a level control signal;

a channel controller means for generating said divisor control and level control signals and for generating said reception and transmission channel designation signals in accordance with a channel designation signal; and second adding means for adding the output signal of said demodulator means to the output signal of said level controller means in reverse phase.

4. A transceiver frequency synthesizer comprising: means for generating a reference oscillation signal; an oscillator means responsive to said reference oscillation signal for generating a local oscillation signal for use in receiving an incoming carrier wave, the frequency of said local oscillation signal being changed in response to a transmission channel designation signal; a carrier means responsive to a control signal and to said reference oscillation signal for generating an outgoing carrier wave for use in transmission, the frequency of said outgoing carrier wave being changed in response to a transmission channel designation signal; difference means for generating a difference signal representing the frequency difference between said local oscillation signal and said outgoing carrier wave; adding means for combining a modulating signal and said difference signal and for providing the sum as said control signal to said carrier means; and feedback means for negatively feeding back said difference signal via said adding means so that the modulation sensitivity of said carrier means to said modulating signal is substantially constant over a broad range of outgoing carrier wave frequencies and over a broad range of modulating signal levels.

5. A transceiver frequency synthesizer as claimed in claim 4, wherein the frequency difference between said outgoing carrier and local oscillation signals is constant, and wherein said difference means includes a mixer for mixing said outgoing carrier and local oscillation signals to produce said difference signal, and wherein said negative feedback means comprises a frequency divider means for frequency-dividing said difference signal by a prescribed divisor; a demodulator means for frequency-demodulating the output signal of said frequency divider means; and wherein said adding means comprises an adder for adding the output signal of said demodulator means to said modulating signal supplied to said adding means in reverse phase.

6. A transceiver frequency synthesizer as claim in claimed 4, wherein the frequency difference between said outgoing carrier and local oscillation signals varies with a channel designation signal, and wherein said difference means includes a mixer for mixing said outgoing carrier and local oscillation signals to produce said difference signal, and wherein said negative feedback means comprises a frequency divider means for frequency dividing said difference signal by a variable divisor in accordance with a divisor control signal; a demodulator means for frequency-demodulating the output signal of said frequency divider means; a level controller means for controlling the level of said modulating signal in accordance with a level control signal; a channel controller means responsive to said channel designation signal for generating said divisor control and level control signals and for generating said reception and transmission channel designation signals; and wherein said adding means comprises second adding means for adding the output signal of said demodulator means to the output signal of said level controller means in reverse phase.

7. A frequency synthesizer, comprising:
means for generating a reference oscillation signal;
first oscillator means for generating a first oscillation signal in response to said reference oscillation signal, the frequency of said first oscillation signal being changed in response to a first control signal;

second oscillator means for generating a second oscillation signal in response to said reference oscillation signal and in response to a modulation control signal, the frequency of said second oscillation signal being changed in response to a second control signal;

difference means for receiving said first and second oscillation signals and generating a difference signal representing the frequency difference between said first and second oscillation signals;

combining means for negatively combining said difference signal with a modulation signal to generate said modulation control signal.

8. A frequency synthesizer as claimed in claim 7, wherein said combining means comprises a subtractor for subtracting said difference signal from said modulation signal.

9. A frequency synthesizer as claimed in claim 7, wherein the frequency difference between said first and second oscillation signals is constant, and wherein said difference means comprises a mixer for mixing said first and second oscillation signals and providing a mixer output signal, a divider for frequency dividing said mixer output signal and a frequency demodulator for frequency demodulating the output signal of said divider and for providing said difference signal.

10. A frequency synthesizer as claimed in claim 9, wherein the frequency difference between said first and second oscillation signals varies with a third control signal, and said divider is a variable divider having a division ratio variable in accordance with a division control signal, said synthesizer further comprising a level control means for controlling the level of said modulation signal in accordance with a level control signal, and control means responsive to said third control signal for generating said division and level control signals and said first and second control signals.

* * * * *

UNITED STATES PATENT AND TRADEMARK OFFICE
CERTIFICATE OF CORRECTION

PATENT NO. : 4,528,522

DATED : July 9, 1985

INVENTOR(S) : Takashi MATSUURA, Tokyo Japan

It is certified that error appears in the above-identified patent and that said Letters Patent is hereby corrected as shown below:

Column 5, line 4, insert --circuit-- after "additional".

Column 6, line 61, change "second adding" to --an adder--.

Signed and Sealed this

Tenth Day of December 1985

[SEAL]

Attest:

DONALD J. QUIGG

Attesting Officer

Commissioner of Patents and Trademarks